(12) United States Patent
Obata et al.

(10) Patent No.: US 9,490,410 B2
(45) Date of Patent: Nov. 8, 2016

(54) SEMICONDUCTOR LIGHT-EMITTING DEVICE WITH HIGH RELIABILITY AND METHOD OF MANUFACTURING THE SAME

(71) Applicant: KABUSHIKI KAISHA TOSHIBA, Tokyo (JP)

(72) Inventors: Susumu Obata, Nonoichi Ishikawa (JP); Akihiro Kojima, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,877

(22) Filed: Mar. 1, 2015

(65) Prior Publication Data

US 2015/0280089 A1   Oct. 1, 2015

(30) Foreign Application Priority Data

Mar. 27, 2014  (JP) .................................. 2014-065822
Sep. 12, 2014  (JP) .................................. 2014-187093

(51) Int. Cl.

| H01L 33/38 | (2010.01) |
|---|---|
| H01L 33/60 | (2010.01) |
| H01L 33/62 | (2010.01) |
| H01L 33/00 | (2010.01) |
| H01L 33/44 | (2010.01) |
| H01L 33/50 | (2010.01) |
| H01L 33/54 | (2010.01) |

(52) U.S. Cl.
CPC ........... *H01L 33/62* (2013.01); *H01L 33/0079* (2013.01); *H01L 33/44* (2013.01); *H01L 33/505* (2013.01); *H01L 33/54* (2013.01); *H01L 2933/0033* (2013.01); *H01L 2933/0066* (2013.01)

(58) Field of Classification Search
CPC ..... H01L 33/62; H01L 33/44; H01L 33/505; H01L 33/0079
See application file for complete search history.

(56) References Cited

U.S. PATENT DOCUMENTS

2010/0148198 A1   6/2010 Sugizaki et al.
2011/0297997 A1*  12/2011 Izuka ...................... H01L 33/38
                                                                257/99

(Continued)

FOREIGN PATENT DOCUMENTS

| JP | 2000-244012 A | 9/2000 |
| TW | 201238084 A | 9/2012 |
| TW | M470385 U | 1/2014 |

OTHER PUBLICATIONS

Taiwan Office Action dated Jan. 11, 2016, filed in Taiwan counterpart Application No. 104106369, 13 pages (with translation).

*Primary Examiner* — Benjamin Sandvik
*Assistant Examiner* — Damon Hillman
(74) *Attorney, Agent, or Firm* — Patterson & Sheridan, LLP

(57) ABSTRACT

According to one embodiment, a semiconductor light-emitting device includes a first electrode and a second electrode provided on the same side of a semiconductor layer. A first insulating film covers the first electrode and the second electrode. Openings in the first insulating film expose portions of the first electrode and the second electrode. Wiring portions are respectively provided on the first insulating film and in the openings in the first insulating films. A first wiring portion is connected to the first electrode and a second wiring portion is connected to the second electrode. A second insulating film is provided between a first wiring portion and a second wiring portion, with a portion of the second insulating film being provided in a gap between the first insulating film and the first wiring portion.

16 Claims, 14 Drawing Sheets

(56) References Cited

U.S. PATENT DOCUMENTS

2013/0015483 A1* 1/2013 Shimokawa ............ H01L 33/46 257/98
2013/0320383 A1 12/2013 Izuka et al.
2014/0175471 A1 6/2014 Akimoto et al.

* cited by examiner

SEMICONDUCTOR LIGHT-EMITTING DEVICE WITH HIGH RELIABILITY AND METHOD OF MANUFACTURING THE SAME

CROSS-REFERENCE TO RELATED APPLICATION

This application is based upon and claims the benefit of priority from Japanese Patent Application No. 2014-065822, filed Mar. 27, 2014 and Japanese Patent Application No. 2014-187093, filed Sep. 12, 2014; the entire contents of both are incorporated herein by reference.

FIELD

Embodiments described herein relates generally to a semiconductor light-emitting device and a method of manufacturing the same.

BACKGROUND

Semiconductor light-emitting devices having a chip-size package structure in which a phosphor layer is provided on one side of a light-emitting layer and an electrode, a wiring layer, and a resin layer are provided on another side of the light-emitting layer have been proposed. However, these devices require high reliability for practical use.

DETAILED DESCRIPTION

Figure 1:
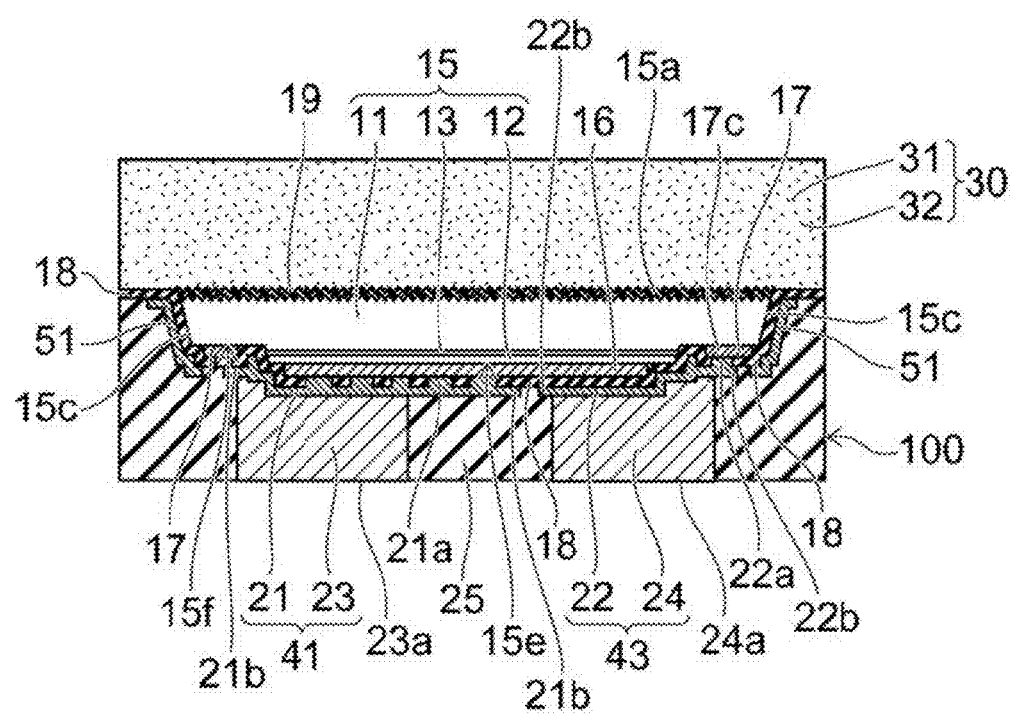
FIG. 1 is a schematic cross-sectional view illustrating a semiconductor light-emitting device according to a first embodiment.

In general, according to one embodiment, a semiconductor light-emitting device comprises a semiconductor layer having a first side and a second side with a light-emitting layer between the first and second sides. A first electrode is disposed on the second side of the semiconductor layer. A second electrode is also disposed on the second side of the semiconductor layer. A first insulating film is provided on the second side of the semiconductor layer to cover the first electrode and the second electrode. The first insulating film includes openings therein exposing or providing respective access to the first and second electrodes. A first wiring portion is disposed on a portion of the first insulating film and is connected to the first electrode through a first opening in the first insulating film. A second wiring portion is disposed on a portion of the first insulating film and is connected to the second electrode through a second opening in the first insulating film. A second insulating film is disposed between the first wiring portion and the second wiring portion. A portion of the second insulating film is disposed between the first insulating film and the first wiring portion.

Hereinafter, example embodiments will be described with reference to the accompanying drawings. A component depicted in multiple drawings is denoted by the same reference numeral in the different drawings.

FIG. 1 is a schematic cross-sectional view illustrating a semiconductor light-emitting device according to a first embodiment.

Figure 2A:
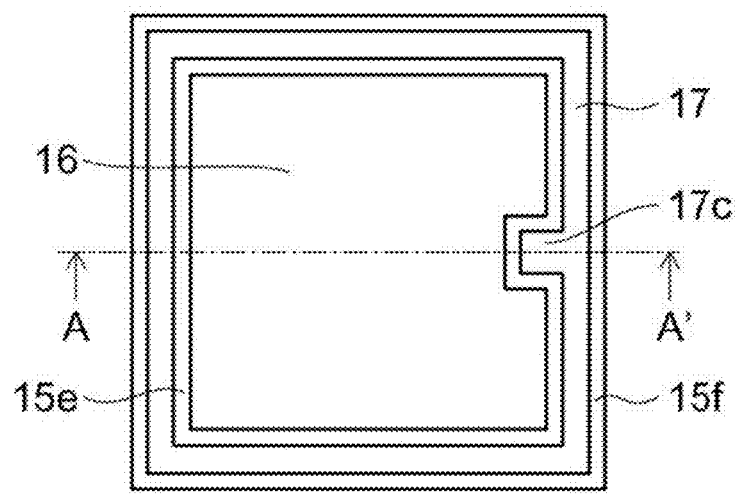
FIGS. 2A and 2B are schematic plan views illustrating a semiconductor light-emitting device according to a first embodiment.

FIG. 2A is a schematic plan view illustrating example planar layouts for a p-side electrode 16 and an n-side electrode 17 in the semiconductor light-emitting device according to the embodiment. FIG. 1 corresponds to a cross-section taken along line A-A' of FIG. 2A. FIG. 2A corresponds to a view as seen from a second surface side (the lower surface side in FIG. 1) of a semiconductor layer 15 without inclusion of wiring portions 41 and 43, a resin layer 25, an insulating film 18, and a reflection film 51 depicted in FIG. 1. In addition, FIG. 2A corresponds to a top view of a laminate body (without inclusion of a substrate 10) depicted in FIG. 5B.

Figure 2B:
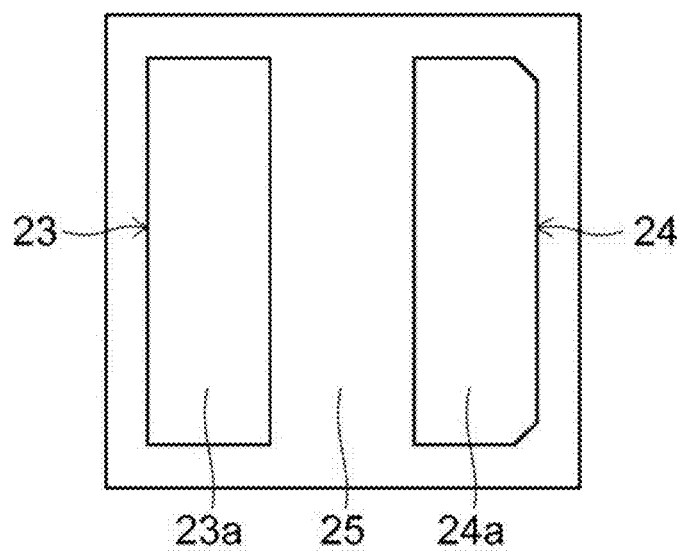

FIG. 2B is a schematic plan view of a mounting surface (lower surface of the semiconductor light-emitting device of FIG. 1) of the semiconductor light-emitting device according to the first embodiment.

The disclosed semiconductor light-emitting device includes the semiconductor layer 15 having a light-emitting layer 13. The semiconductor layer 15 includes a first surface (first side) 15a which is a light extraction side and a second surface 15b (second side) (see FIG. 4A) on the opposite side thereto.

Figure 5A:
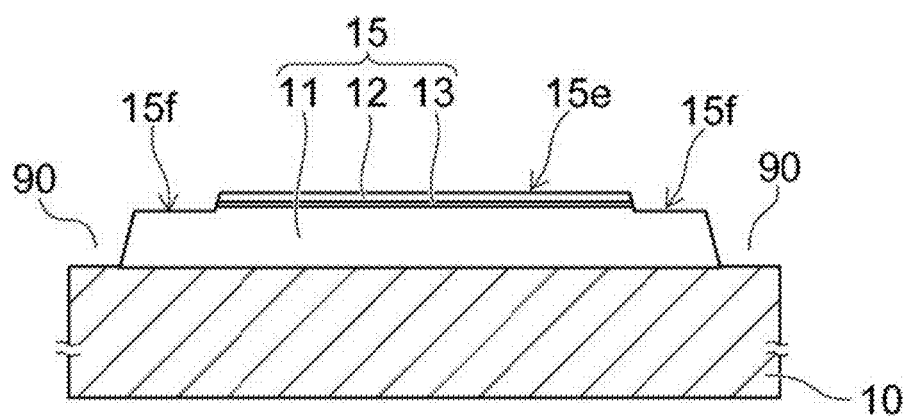

As illustrated in FIG. 5A, the second surface 15b of the semiconductor layer 15 includes a first portion (emission region) 15e that includes the light-emitting layer 13, and a second portion (non-emission region) 15f that does not include the light-emitting layer 13. The first portion 15e including the light-emitting layer 13 is a portion in the semiconductor layer 15 having the light-emitting layer 13 laminated thereto. The second portion 15f that does not include the light-emitting layer 13 is a portion in the semiconductor layer 15 on which the light-emitting layer 13 is not laminated. The first portion 15e indicates a region having a laminated structure from which emission light from the light-emitting layer 13 may be extracted to the outside.

On the second surface side (15b), the p-side electrode 16 is provided as a first electrode on the first portion 15e, and the n-side electrode 17 is provided as a second electrode on the second portion 15f.

In the example illustrated in FIG. 2A, the second portion 15f surrounds the first portion 15e, and the n-side electrode 17 surrounds the p-side electrode 16.

A current is supplied to the light-emitting layer 13 through the p-side electrode 16 and the n-side electrode 17, and thus the light-emitting layer 13 emits light. Light emitted from the light-emitting layer 13 is emitted to the outside of the semiconductor light-emitting device primarily from the first surface 15a side.

As illustrated in FIG. 1, a support body 100 is provided on the second surface side (15b) of the semiconductor layer 15. A light-emitting element including the semiconductor layer 15, the p-side electrode 16, and the n-side electrode 17 is supported by the support body 100 provided on the second surface side.

A phosphor layer 30 is provided as an optical layer on the first surface 15a side of the semiconductor layer 15. The phosphor layer 30 includes a plurality of particulate phosphors 31. The phosphors 31 are excited by radiation light (emitted light) of the light-emitting layer 13, and then radiate light having a wavelength different from that of the radiation light.

The plurality of phosphors 31 is included in a bonding material 32. The bonding material 32 transmits the radiation light of the light-emitting layer 13 and the radiation light of the phosphors 31. The term "transmit" as used herein also includes a case where a portion of light is absorbed and bonding material 32 is not limited to materials having a transmittance of 100% at the emitted or generated wavelengths.

The semiconductor layer 15 includes a first semiconductor layer 11, a second semiconductor layer 12, and the light-emitting layer 13. The light-emitting layer 13 is provided between the first semiconductor layer 11 and the second semiconductor layer 12. The first semiconductor layer 11 and the second semiconductor layer 12 include, for example, gallium nitride.

The first semiconductor layer 11 includes, for example, a base buffer layer and an n-type GaN layer. The second semiconductor layer 12 includes, for example, a p-type GaN layer. The light-emitting layer 13 may include a material that emits blue light, purple light, ultraviolet light, or the like or mixtures of these colors. An emission peak wavelength of the light-emitting layer 13 is, for example, in a range of 430 nm to 470 nm.

The second surface of the semiconductor layer 15 is processed such that the first portion 15e that includes the light-emitting layer 13 is protruding and the second portion 15f that does not include the light-emitting layer 13 is recessed—that is, as depicted in FIG. 5A, the first portion 15e protrudes from the second portion 15f such that the second surface of the semiconductor layer 15 has at least two levels. The exposed surface of the first portion 15e is a surface of the second semiconductor layer 12, and the p-side electrode 16 is provided on this surface of the second semiconductor layer 12. The exposed surface of the second portion 15f is a surface of the first semiconductor layer 11, and the n-side electrode 17 is provided on this surface of the first semiconductor layer 11.

On the second surface of the semiconductor layer 15, f the first portion 15e that includes the light-emitting layer 13 is wider (e.g., along the left-right page direction in FIG. 5A) than the second portion 15f that does not include the light-emitting layer 13. In addition, an area of the p-side electrode 16 provided on the surface of the first portion 15e is greater than an area of the n-side electrode 17 provided on the surface of the second portion 15f. Accordingly, a relatively large emission surface is obtained, and thus it is possible to increase a light output.

As illustrated in FIG. 2A, the n-side electrode 17 includes, for example, four linear portions and is generally rectangular. One of the four linear portions (e.g., one side of the square/rectangle in FIG. 2A) is provided with a contact portion 17c that protrudes in the width direction of the linear portion. As illustrated in FIG. 1, a via hole 22a of an n-side wiring layer 22 is connected to the surface of the contact portion 17c.

As illustrated in FIG. 1, the second surface of the semiconductor layer 15, the p-side electrode 16, and the n-side electrode 17 are covered with the insulating film (first insulating film) 18. The insulating film 18 is an inorganic insulating film such as, for example, a silicon oxide film. The insulating film 18 is also provided on the side surface of the light-emitting layer 13 and the side surface of the second semiconductor layer 12 so as to cover these side surfaces.

In addition, the insulating film 18 is also provided on a side surface (side surface of the first semiconductor layer 11) 15c that extends from the first surface 15a. The insulating film 18 covers the side surface 15c.

Further, the insulating film 18 is also provided in a region outside the periphery of the side surface 15c of the semiconductor layer 15. The insulating film 18 outside the periphery of the side surface 15c may extend along a surface that is at the same level as the first surface 15a within the chip.

A p-side wiring layer 21 as a first wiring layer and an n-side wiring layer 22 as a second wiring layer are provided on the insulating film 18 so as to be separated from each other. As illustrated in FIG. 6B, a plurality of first openings 18a opened to the p-side electrode 16 and a second opening 18b opened to the contact portion 17c of the n-side electrode 17 are formed in the insulating film 18. While depicted in FIG. 6B as a plurality of openings, the first openings 18a may in some embodiments be replaced with one opening (a single first opening 18a). The available contact area in the single first opening 18a may be substantially equivalent or greater than a total available contact area through the plurality of first openings 18a.

The p-side wiring layer 21 is provided on the insulating film 18 and within the first openings 18a. The p-side wiring layer 21 is electrically connected to the p-side electrode 16 through vias 21a provided within the first openings 18a.

The n-side wiring layer 22 is provided on the insulating film 18 and within the second opening 18b. The n-side wiring layer 22 is electrically connected to the contact portion 17c of the n-side electrode 17 through a via 22a provided within the second opening 18b.

The p-side wiring layer 21 and the n-side wiring layer 22 extend on the insulating film 18 so as to occupy the major part of a region on the second surface side. The p-side wiring layer 21 is connected to the p-side electrode 16 through the plurality of vias 21a.

In addition, the side surface 15c of the semiconductor layer 15 is covered with the reflection film 51 disposed on the insulating film 18. The reflection film 51 does not directly contact the side surface 15c, and thus is not electrically connected to the semiconductor layer 15 because it is separated by the insulating film 18. The reflection film 51 is also separate from the p-side wiring layer 21 and the n-side wiring layer 22. The reflection film 51 has reflectivity with respect to the radiation light of the light-emitting layer 13 and the radiation light of the phosphors 31.

Figure 7A:
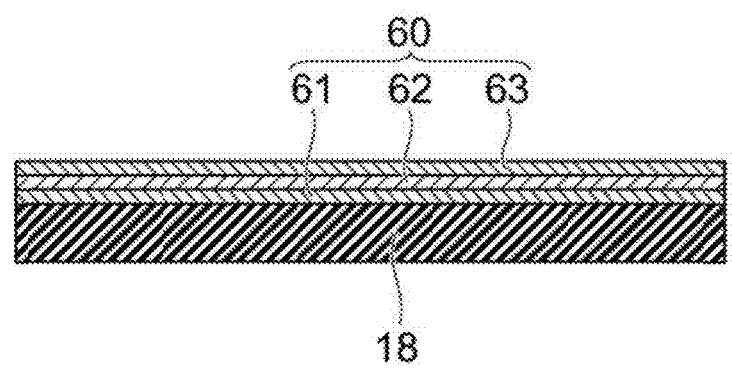

The reflection film 51, the p-side wiring layer 21, and the n-side wiring layer 22 may comprise copper films, which are simultaneously formed on a common metal film 60 illustrated in FIG. 7A by, for example, plating.

For example, the copper films of the reflection film 51, the p-side wiring layer 21, and the n-side wiring layer 22 are formed by plating on the metal film 60 that has been formed on the insulating film 18. The overall thickness of each of the reflection film 51, the p-side wiring layer 21, and the n-side wiring layer 22 is generally greater than the thickness of the metal film 60.

The metal film 60 includes a base metal film 61, an adhesion layer 62, and a seed layer 63 which are sequentially laminated from the insulating film 18 side. That is, the base metal film 61 is directly contacting the insulating film 18 and the adhesion layer 62 is between the base metal film 61 and the seed layer 63.

The base metal film 61 is, for example, an aluminum film having high reflectivity with respect to the radiation light of the light-emitting layer 13.

The seed layer 63 is a copper film which allows for depositing additional copper by plating. The adhesion layer is, for example, a titanium film having excellent wettability with respect to both aluminum and copper.

For some embodiments, in the region outside the periphery of the side surface 15c, the reflection film 51 may simply be the metal film 60 without an additional plating film (e.g., a copper film) formed thereon. The reflection film 51 formed by the metal film 60 includes at least the base film 61, which may be aluminum and thus has high reflectivity with respect to the radiation light of the light-emitting layer 13 and the radiation light of the phosphors 31.

In addition, since the base metal film (aluminum film) 61 also remains under the p-side wiring layer 21 and the n-side wiring layer 22, the aluminum film 61 is formed so as to extend in the major part of the region on the second surface side. Thus, it is possible to increase the amount of light directed to the phosphor layer 30 side.

A p-side metal pillar 23 as a first metal pillar is provided on the surface of the p-side wiring layer 21 which is opposite to the semiconductor layer 15. The p-side wiring layer 21 and the p-side metal pillar 23 collectively form the p-side wiring portion (first wiring portion) 41.

An n-side metal pillar 24 as a second metal pillar is provided on the surface of the n-side wiring layer 22 which is opposite to the semiconductor layer 15. The n-side wiring layer 22 and the n-side metal pillar 24 collectively form the n-side wiring portion (second wiring portion) 43.

The resin layer 25 as a second insulating film is provided between the p-side wiring portion 41 and the n-side wiring portion 43. The resin layer 25 is provided between the p-side metal pillar 23 and the n-side metal pillar 24 so as to contact the side surface of the p-side metal pillar 23 and the side surface of the n-side metal pillar 24. That is, the resin layer 25 is filled between the p-side metal pillar 23 and the n-side metal pillar 24.

In addition, the resin layer 25 is provided between the p-side wiring layer 21 and the n-side wiring layer 22, between the p-side wiring layer 21 and the reflection film 51, and between the n-side wiring layer 22 and the reflection film 51.

The resin layer 25 is provided on the periphery of the p-side metal pillar 23 and on the periphery of the n-side metal pillar 24 so as to cover the side surface of the p-side metal pillar 23 and the side surface of the n-side metal pillar 24.

In addition, the resin layer 25 is also provided in the region outside the periphery of the side surface 15c of the semiconductor layer 15 to cover the reflection film 51.

An end (surface) of the p-side metal pillar 23 on the opposite side to the p-side wiring layer 21 is exposed from the resin layer 25, and may function as a p-side external terminal 23a capable of being connected to an external circuit such as a mounting board. An end (surface) of the n-side metal pillar 24 on the opposite side to the n-side wiring layer 22 is exposed from the resin layer 25, and may function as an n-side external terminal 24a capable of being connected to an external circuit such as a mounting board. The p-side external terminal 23a and the n-side external terminal 24a are bonded to a landing pattern of the mounting board through, for example, solder or a conductive bonding material.

As illustrated in FIG. 2B, the p-side external terminal 23a and the n-side external terminal 24a are formed so as to be separated from each other and aligned in the same plane (outer surface) of the resin layer 25. For example, the p-side external terminal 23a is formed to have a rectangular shape, and the n-side external terminal 24a is formed to have a shape in which two corners of a rectangle, which has the same size as the rectangle of the p-side external terminal 23a, are notched. Thus, it is possible to determine the polarity of the external terminal. Naturally, the n-side external terminal 24a may also be formed to have a rectangular shape, and the p-side external terminal 23a may also be formed to have a shape in which corners of a rectangle are notched.

An interval between the p-side external terminal 23a and the n-side external terminal 24a is wider than an interval between the p-side wiring layer 21 and the n-side wiring layer 22 on the insulating film 18. The interval between the p-side external terminal 23a and the n-side external terminal 24a can be made larger than the spacing distance required for solder mounting processes, for example. Thus, it is possible to prevent from a short circuit between the p-side external terminal 23a and the n-side external terminal 24a due to the soldering.

It is also possible to narrow the interval between the p-side wiring layer 21 and the n-side wiring layer 22 up to the process limit for patterning. Thus, it is possible to enlarge an area of the p-side wiring layer 21 and a contact area between the p-side wiring layer 21 and the p-side metal pillar 23. Thus, it is possible to promote the heat radiation of the light-emitting layer 13.

In addition, an area where the p-side wiring layer 21 contacts the p-side electrode 16 through the plurality of vias 21a is wider than an area where the n-side wiring layer 22 contacts the n-side electrode 17 through the via 22a. Thus, it is possible to make the distribution of the current flowing to the light-emitting layer 13 more uniform (uniformize).

An area of the n-side wiring layer 22 extending on the insulating film 18 may be made wider than an area of the n-side electrode 17. An area of the n-side metal pillar 24 (area of the n-side external terminal 24a) which is provided on the n-side wiring layer 22 may be made wider than that of the n-side electrode 17. Thus, it is possible to reduce the area of the n-side electrode 17 while securing the area of the n-side external terminal 24a which is sufficient for highly-reliable mounting. That is, it is possible to improve a light output by reducing the area of the portion (non-emission region) 15f in the semiconductor layer 15 which does not include the light-emitting layer 13 and by enlarging the area of the portion (emission region) 15e that includes the light-emitting layer 13.

The first semiconductor layer 11 is electrically connected to the n-side metal pillar 24 through the n-side electrode 17 and the n-side wiring layer 22. The second semiconductor layer 12 is electrically connected to the p-side metal pillar 23 through the p-side electrode 16 and the p-side wiring layer 21.

The thickness of the p-side metal pillar 23 (thickness in a direction in which the p-side wiring layer 21 is connected to the p-side external terminal 23a) is larger than the thickness of the p-side wiring layer 21. The thickness of the n-side metal pillar 24 (thickness in a direction in which the n-side wiring layer 22 is connected to the n-side external terminal 24a) is larger than the thickness of the n-side wiring layer 22. The thickness of each of the p-side metal pillar 23, the n-side metal pillar 24, and the resin layer 25 is larger than that of the semiconductor layer 15.

An aspect ratio (ratio of a thickness to a plane size) of each of the metal pillars 23, 24 may be equal to or larger than 1 or may be less than 1. That is, the metal pillars 23, 24 may be thicker or thinner than the plane size.

The thickness of the support body 100 including the p-side wiring layer 21, the n-side wiring layer 22, the p-side metal pillar 23, the n-side metal pillar 24, and the resin layer 25 is larger than the thickness of a light-emitting element (LED chip) which includes the semiconductor layer 15, the p-side electrode 16, and the n-side electrode 17.

The semiconductor layer 15 can be formed on a substrate by an epitaxial growth method as will be described later. This (growth) substrate is removed after forming the support body 100, and thus the finished semiconductor layer 15 does not include this substrate on the first surface 15a side. The semiconductor layer 15 is supported by the support body 100, which includes a complex of the metal pillars 23 and 24 and the resin layer 25, rather than by a rigid plate-shaped substrate.

For example, copper, gold, nickel, or silver may be used as materials of the p-side wiring portion 41 and the n-side wiring portion 43. Using copper among these materials may result in improvements in thermal conductivity, high migration resistance, and adhesion to an insulating material.

The resin layer 25 reinforces the p-side metal pillar 23 and the n-side metal pillar 24. A layer having a thermal expansion coefficient which is the same as or close to that of the mounting board is preferably used as the resin layer 25. The resin layer 25 may include, for example, a resin mainly including an epoxy resin, a resin mainly including a silicone resin, and a resin mainly including a fluorinated resin.

In addition, a light shielding material (a light absorbing agent, a light reflecting agent, a light scattering agent, and the like) is included in a resin serving as a base in the resin layer 25, and the resin layer 25 has a light shielding property with respect to emission light of the light-emitting layer 13. Thus, it is possible to suppress light leakage from the mounting surface side and the side surface of the support body 100.

Stress caused by solder or the like for bonding the p-side external terminal 23a and the n-side external terminal 24a to the land of the mounting board is applied to the semiconductor layer 15 by a thermal cycle during mounting the semiconductor light-emitting device. The p-side metal pillar 23, the n-side metal pillar 24, and the resin layer 25 absorb and relax the stress. In particular, the resin layer 25 which is more flexible than the semiconductor layer 15 is used as a portion of the support body 100, and thus it is possible to improve the stress relaxation effect.

The reflection film 51 is separated from the p-side wiring portion 41 and the n-side wiring portion 43. For this reason, stress applied to the p-side metal pillar 23 and the n-side metal pillar 24 during mounting is not transmitted to the reflection film 51. Accordingly, it is possible to suppress the exfoliation (peeling) of the reflection film 51. In addition, it is possible to suppress the stress applied to the side surface 15c side of the semiconductor layer 15.

As will be described later, the substrate used to form the semiconductor layer 15 is eventually removed from the semiconductor layer 15. Thus, the height of the semiconductor light-emitting device is lowered. In addition, by removing the substrate, it is possible to form minute irregularities (surface roughness) in the first surface 15a and to thus improve light extraction efficiency.

For example, the minute irregularities are formed by performing wet etching using an alkali-based solution on the first surface 15a. Thus, it is possible to improve light extraction efficiency by reducing total internal reflection at the first surface 15a.

After the (growth) substrate is removed, the phosphor layer 30 is formed on the first surface 15a via an insulating film 19. The insulating film 19 functions as an adhesion layer that increases adhesion between the semiconductor layer 15 and the phosphor layer 30. For example, the insulating film is a silicon oxide film or a silicon nitride film.

The phosphor layer 30 has a structure in which a plurality of particulate phosphors 31 is distributed in the bonding material 32. For example, a silicone resin may be used for the bonding material 32.

The phosphor layer 30 is also formed on the region outside the periphery of the side surface 15c of the semiconductor layer 15. Accordingly, the plane size of the phosphor layer 30 is larger than the plane size of the semiconductor layer 15. In the region outside the side surface 15c, the phosphor layer 30 is provided on the insulating film 18.

The phosphor layer 30 is limited to the upper side of the first surface 15a of the semiconductor layer 15 and to the upper side of a region adjacent to the side surface 15c of the semiconductor layer 15, and does not go around the second surface side of the semiconductor layer 15, the peripheries of the metal pillars 23 and 24, and the side surface of the support body 100. The side surface of the phosphor layer 30 and the side surface of the support body 100 (side surface of the resin layer 25) are aligned with each other.

That is, the semiconductor light-emitting device according to the first embodiment may have an extremely small-sized semiconductor light-emitting device with a chip-sized package structure. For this reason, the degree of freedom in designing a lighting fixture increases, for example, in a case of the application to a lighting fixture.

In addition, the phosphor layer 30 material is not wastefully formed on the mounting surface side from which light is not extracted, and thus it is possible to reduce costs. In addition, it is possible to radiate heat generated by the light-emitting layer 13 to the mounting board side through the p-side wiring layer 21 and the n-side wiring layer 22 which extend on the second surface side, in spite of the absence of the substrate on the first surface 15a side, which results in a reduction in size and an excellent heat radiation property.

In a typical flip-chip mounting, an LED chip is mounted on a mounting board through microbumps or the like, and then a phosphor layer is formed so as to cover the entire chip. Alternatively, a resin is underfilled between the bumps.

On the other hand, according to the first embodiment, a resin layer 25 that is different from the phosphor layer 30 is provided on the periphery of the p-side metal pillar 23 and on the periphery of the n-side metal pillar 24 before mounting occurs, and thus it is possible to give this resin characteristics which are suitable for the relaxation of stress at the mounting surface side. In addition, since the resin layer 25 is already provided on the mounting surface side, underfilling (filling gaps between pillars with resin) after the mounting becomes unnecessary.

A layer (phosphor layer 30) may be designed to prioritize light extraction efficiency, color conversion efficiency, and a light distribution characteristics can be provided on the first surface 15a side, and a layer (resin layer 25) which prioritizes the relaxation of stress during mounting and characteristics as a support is provided on the mounting surface side. For example, the resin layer 25 has a structure in which a filler such as silica particles is filled at a high density in a resin serving as abase support, and may be adjusted to have an appropriate hardness as the support.

Light radiated to the first surface 15a side from the light-emitting layer 13 is incident on the phosphor layer 30, and a portion of the emitted light excites the phosphor 31. Thus, for example, white light can be obtained as a mixed light of the light of the light-emitting layer 13 and the light of the phosphor 31.

When a substrate is present on the first surface 15a, there is light leaking to the outside from the side surface of the substrate without being incident on the phosphor layer 30. That is, light of the light-emitting layer 13 leaks from the side surface of the substrate, which may result in color degradation and color unevenness such as a phenomenon in which a ring of blue light is seen on the outer edge side when the phosphor layer 30 when viewed from the upper surface thereof.

On the other hand, according to the first embodiment, since the substrate is not present between the first surface 15a and the phosphor layer 30, it is possible to prevent color degradation and color unevenness from occurring due to the leakage of light from the light-emitting layer 13 from the side surface of the substrate.

Further, according to the first embodiment, the reflection film 51 is provided on the side surface 15c of the semiconductor layer 15 via the insulating film 18. Light directed to the side surface 15c of the semiconductor layer 15 from the light-emitting layer 13 is reflected by the reflection film 51 and does not leak to the outside in a horizontal direction. For this reason, it is possible to prevent color degradation and color unevenness from occurring due to light leakage from the side surface side of the semiconductor light-emitting device, in conjunction with a feature that the substrate is not present on the first surface 15a side.

The insulating film 18 provided between the reflection film 51 and the side surface 15c of the semiconductor layer 15 prevents a metal included in the reflection film 51 from being distributed (migrating) into the semiconductor layer 15. Thus, it is possible to prevent the semiconductor layer 15 from being contaminated with a metal, for example, GaN, and to prevent the semiconductor layer 15 from being degraded.

In addition, the insulating film 18 provided between the reflection film 51 and the phosphor layer 30 and between the resin layer 25 and the phosphor layer 30 improves adhesion between the reflection film 51 and the phosphor layer 30 and adhesion between the resin layer 25 and the phosphor layer 30.

The insulating film 18 is an inorganic insulating film such as, for example, a silicon oxide film or a silicon nitride film. That is, the first surface 15a and the second surface of the semiconductor layer 15, the side surface 15c of the first semiconductor layer 11, the side surface of the second semiconductor layer 12, and the side surface of the light-emitting layer 13 are covered with the inorganic insulating film. The inorganic insulating film surrounds the semiconductor layer 15 to protect the semiconductor layer 15 against metals, moisture, and the like.

Figure 3A:
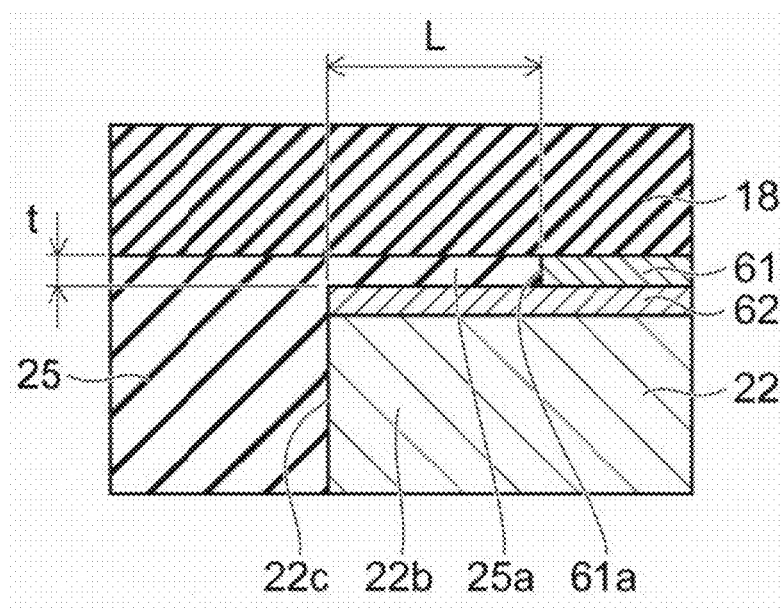
FIG. 3A is a schematic enlarged cross-sectional view of a portion A in FIG. 3B.
Figure 3B:
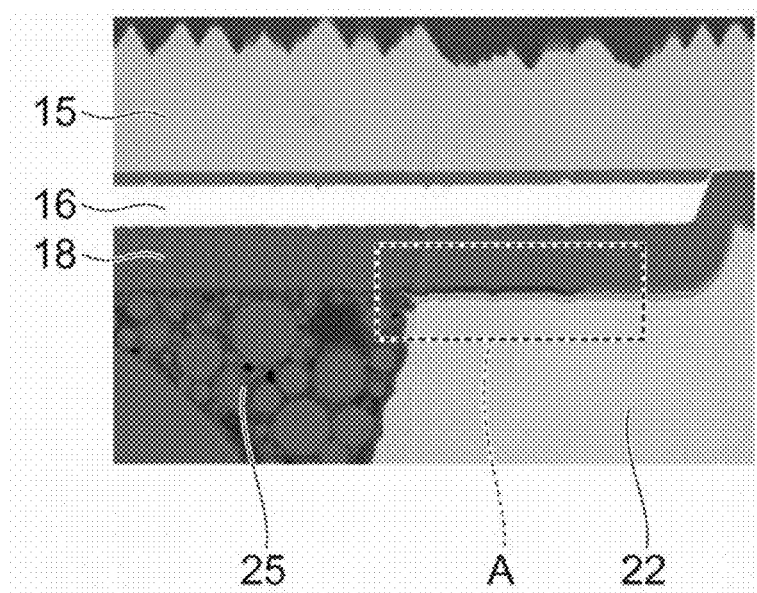
FIG. 3B is an electron microscope image of a cross-section of a portion of a semiconductor light-emitting device according to an embodiment.

Here, FIG. 3B illustrates an electron microscope image of a cross-section of a portion of the semiconductor light-emitting device according to the first embodiment. FIG. 3B illustrates the vicinity of an end of the n-side wiring layer 22 which is close to the p-side wiring layer 21.

In addition, FIG. 3A is a schematic enlarged cross-sectional view of a portion A in FIG. 3B.

As described above with reference to FIG. 7A, the base metal film (aluminum film) 61, the adhesion layer (titanium film) 62, and the seed layer (copper film) 63 are sequentially formed on the insulating film 18. Then, the copper wiring layers 21, 22 are formed on the seed layer (copper film) 63 by plating. As depicted in FIGS. 3A and 3B, the seed layer 63 though present is not distinctly depicted from the copper wiring layer 22 in the electron micrograph.

Since the seed layer 63 and the wiring layers 21, 22 are the same copper films, the seed layer is depicted as being integrated with the n-side wiring layer 22 in FIG. 3A. That is, the wiring layers 21, 22 include the seed layer as a portion thereof.

Meanwhile, the adhesion layer (titanium film) 62 is provided on the entirety of the wiring layers 21, 22. Accordingly, it is also possible to refer to the wiring layers 21, 22 inclusive of the adhesion layer 62.

According to the first embodiment, as illustrated in FIG. 3A, a region where the base metal film (aluminum film) 61 is not provided is present between the n-side wiring layer 22 and the insulating film 18. A portion 25a of the resin layer 25 is embedded between an end 22b of the n-side wiring layer 22 and the insulating film 18.

Figure 13A:
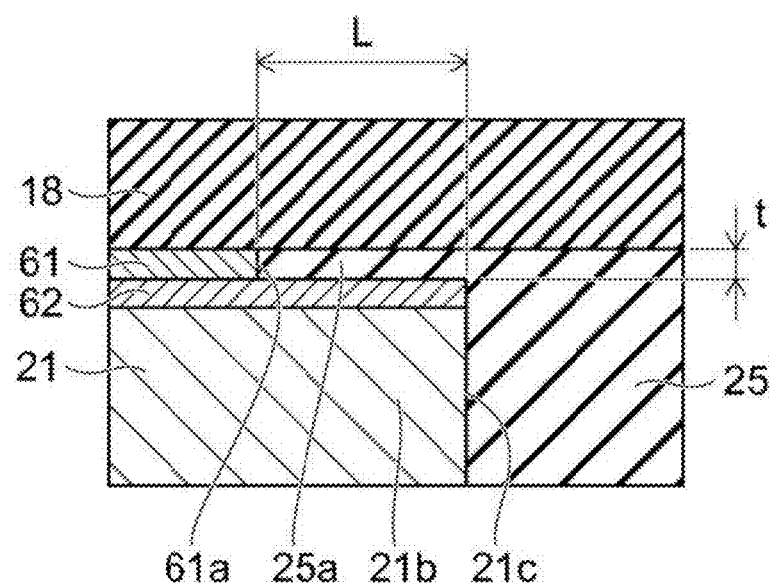
FIG. 13A is a schematic cross-sectional view of a semiconductor light-emitting device according to an embodiment.
Figure 13B:
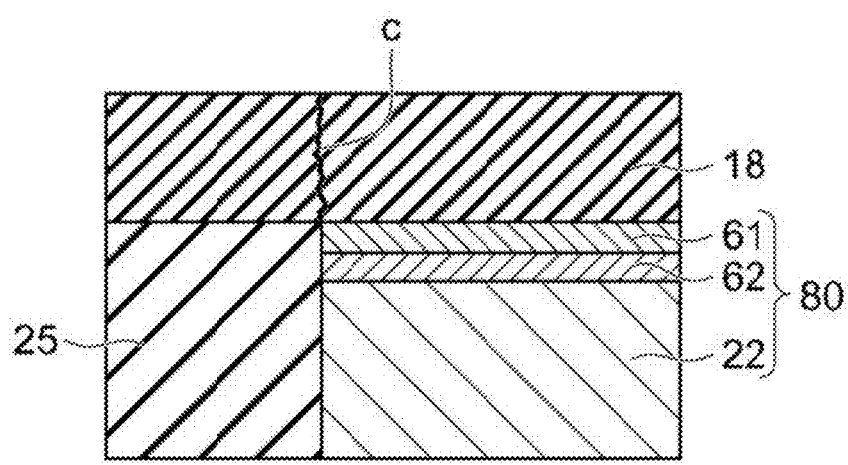
FIG. 13B is a schematic cross-sectional view of a semiconductor light-emitting device according to a reference example.

Here, FIG. 13B illustrates a schematic cross-sectional view of the vicinity of the end of the wiring layer 22 according to a reference example. In the reference example, the base metal film 61 is provided on the entirety of the region between the n-side wiring layer 22 and the insulating film 18. Accordingly, the edge (side surface) of the n-side wiring layer 22, the edge of the adhesion layer 62, and the edge of the base metal film 61 are aligned with each other.

There is a tendency for stronger stress to be applied to an interface between an inorganic film and a metal film, rather than to an interface between an inorganic film and a resin. In the structure of FIG. 13B, stress is likely to particularly concentrate on an interface between an end of a metal film 80 in the vicinity of the edge and the insulating film 18, and thus there is the possibility of a crack C occurring in the insulating film 18 in the vicinity of the edge of the metal film 80.

When moisture is infiltrated from an interface between the n-side external terminal 24a and the resin layer 25, the moisture may reach the crack C occurring in the insulating film 18 through an interface between the side surface of the n-side metal pillar 24 and the resin layer 25 and through an interface between the n-side wiring layer 22 and the resin layer 25. According to the reference example of FIG. 13B, an interface between the side surface (edge) of the metal film 80 and the resin layer 25, which serves as an infiltration path of moisture, is likely to linearly connect toward the crack C, and thus is likely to permit moisture to be infiltrated into the crack C.

The moisture reaching the electrodes 16 and 17 and the semiconductor layer 15 through the crack C of the insulating film 18 may result in the degradation of reliability.

On the other hand, according to the first embodiment, an edge 61a of the (n-side) base metal film 61 contacting the insulating film 18 is retracted further than an edge (side surface) 22c of the n-side wiring layer 22, and the portion 25a of the resin layer 25 is provided between the end 22b of the n-side wiring layer 22 and the insulating film 18, as illustrated in FIG. 3A (see also FIG. 13A).

That is, the interface between the metal and the resin layer 25, which serves as an infiltration path of moisture, bends in a horizontal direction on the way toward the insulating film 18 side.

In the structure of FIG. 3A, stress is likely to concentrate on an interface between an end of the base metal film 61 in the vicinity of the edge 61a and the insulating film 18, and thus a crack is likely to occur in the insulating film 18 contacting the vicinity of the edge 61a of the base metal film 61.

However, even when a crack occurs in the insulating film 18, an infiltration path of moisture directed to the crack side bends in the middle thereof and the infiltration path of moisture up to the crack is longer than that in the reference example illustrated in FIG. 13B, and thus the moisture is not likely to reach the crack. For this reason, the infiltration of moisture into the electrodes 16, 17 and the semiconductor layer 15 is suppressed, and thus it is possible to provide the semiconductor light-emitting device with high reliability.

A film thickness t of the portion 25a of the resin layer 25 provided between the end 22b of the n-side wiring layer 22 (end of the adhesion layer 62) and the insulating film 18 is equal to a film thickness of the base metal film 61. The reflectivity of the aluminum film which is the base metal film 61 increases in proportion to the film thickness up to a thickness of 40 nm and does not increase any more in the case of a film thickness being equal to or larger than 40 nm. Accordingly, the film thickness t is equal to or larger than 40 nm, for example, approximately 100 nm.

In addition, as the amount of retraction of the edge 61a of the base metal film 61 contacting the insulating film 18 from the edge 22c of the n-side wiring layer 22, that is, a length L of the resin layer 25a between the end 22b of the n-side wiring layer 22 and the insulating film 18 increases, a distance between an infiltration path of moisture (interface between the resin layer 25 and the edge 22c of the n-side wiring layer 22) and a position where a crack is likely to occur in the insulating film 18 increases.

In order to suppress the infiltration of moisture into the crack, it is preferable that the length L (see FIG. 3A and FIG. 13A) be, for example, equal to or larger than 2 µm to 3 µm. Even when a crack occurs in the insulating film 18 in the vicinity of the edge 61a of the base metal film 61, a ratio of the length L to the film thickness t being equal to or larger than 10 is sufficient to suppress the moisture reaching the crack.

Although FIG. 3A illustrates a structure in the vicinity of the end 22b of the n-side wiring layer 22, the edge 61a of the base metal film 61 is also retracted in the vicinity of an end 21b of the p-side wiring layer 21 as illustrated in FIG. 13A.

A region where the base metal film (aluminum film) 61 is not provided is present between the p-side wiring layer 21 and the insulating film 18. The portion 25a of the resin layer 25 is buried between the end 21b of the p-side wiring layer 21 and the insulating film 18.

In the configuration of FIG. 13A, even when a crack occurs in the insulating film 18 in the vicinity of the edge 61a of the (p-side) base metal film 61, an infiltration path of moisture directed to the crack bends in the middle thereof and the infiltration path of moisture up to the crack is longer than that in the reference example illustrated in FIG. 13B, and thus the moisture is not likely to reach the crack. For this reason, the infiltration of moisture into the electrodes 16 and 17 and the semiconductor layer 15 is suppressed, and thus it is possible to provide the semiconductor light-emitting device with high reliability.

A film thickness t of the portion 25a of the resin layer 25 provided between the end 21b of the p-side wiring layer 21 (end of the adhesion layer 62) and the insulating film 18 is equal to a film thickness of the base metal film 61. As described above, the film thickness t is equal to or larger than 40 nm, for example, approximately 100 nm.

In addition, as the amount of retraction of the edge 61a of the base metal film 61 contacting the insulating film 18 from an edge 21c of the p-side wiring layer 21, that is, a length L of the resin layer 25a between the end 21b of the p-side wiring layer 21 and the insulating film 18 increases, a distance between an infiltration path of moisture (interface between the resin layer 25 and the edge 21c of the p-side wiring layer 21) and a position where a crack is likely to occur in the insulating film 18 increases.

In order to suppress the infiltration of moisture into the crack, it is preferable that the length L (see FIG. 3A or FIG. 13A) be, for example, equal to or larger than 2 µm to 3 µm. Even when a crack occurs in the insulating film 18 in the vicinity of the edge 61a of the base metal film 61, a ratio of the length L to the film thickness t being equal to or larger than 10 is sufficient to suppress the moisture reaching the crack.

Meanwhile, also in the vicinity of the end 22b of the n-side wiring layer 22 on the opposite side to the p-side wiring layer 21, the edge 61a of the base metal film 61 is retracted from the edge 22c of the n-side wiring layer 22 in a similar manner to FIG. 3A, and the portion 25a of the resin layer 25 is provided in the retracted region.

Similarly, also in the vicinity of the end 21b of the p-side wiring layer 21 on the opposite side to the n-side wiring layer 22, the edge 61a of the base metal film 61 is retracted from the edge 21c of the p-side wiring layer 21 in a similar manner to FIG. 13A, and the portion 25a of the resin layer 25 is provided in the retracted region.

Next, a method of manufacturing a semiconductor light-emitting device will be described with reference to FIG. 4A to FIG. 11B.

Figure 4A:
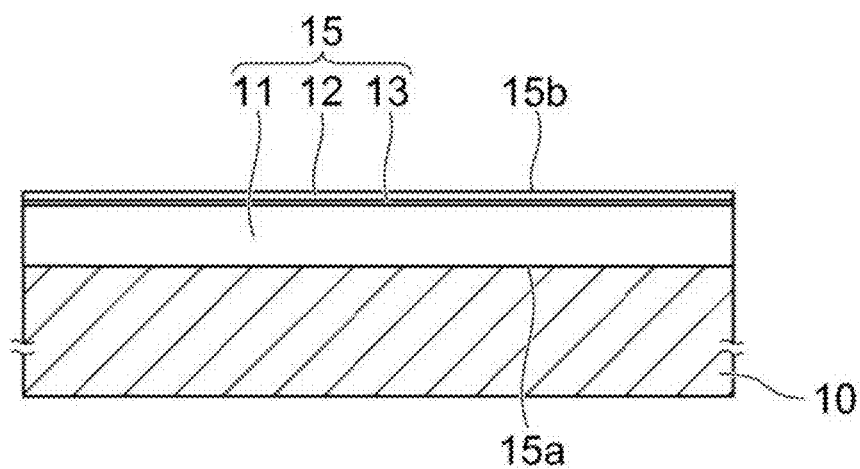
FIGS. 4A-11B are schematic cross-sectional views illustrating a method of manufacturing a semiconductor light-emitting device according to an embodiment.

As illustrated in FIG. 4A, the first semiconductor layer 11, the light-emitting layer 13, and the second semiconductor layer 12 are epitaxially grown in this order on a principal surface of the substrate 10 by, for example, a metal organic chemical vapor deposition (MOCVD) method.

In the semiconductor layer 15, a surface on the substrate 10 side is the first surface 15a, and a surface on the opposite side to the substrate 10 is the second surface 15b.

The substrate 10 is, for example, a silicon substrate. Alternatively, the substrate 10 may be a sapphire substrate. For example, the semiconductor layer 15 is a nitride semiconductor layer including gallium nitride (GaN).

For example, the first semiconductor layer 11 includes a buffer layer provided on the principal surface of the substrate 10 and an n-type GaN layer provided on the buffer layer. For example, the second semiconductor layer 12 includes a p-type AlGaN layer provided on the light-emitting layer 13 and a p-type GaN layer provided thereon. For example, the light-emitting layer 13 has a multiple quantum well (MQW) structure.

Figure 4B:
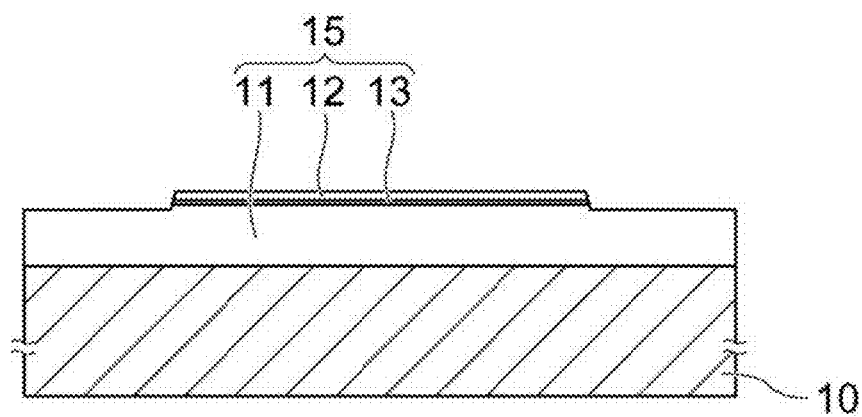

FIG. 4B illustrates a state where portions of the second semiconductor layer 12 and the light-emitting layer 13 are selectively removed. For example, the second semiconductor layer 12 and the light-emitting layer 13 are selectively etched by a reactive ion etching (RIE) method to expose the first semiconductor layer 11.

Next, as illustrated in FIG. 5A, the first semiconductor layer 11 is selectively removed to form a groove 90. The semiconductor layer 15 is separated into a plurality of parts by the groove 90 on the principal surface of the substrate 10. For example, the groove 90 is formed in a grid pattern on a wafer-shaped substrate 10.

The groove 90 passes through the semiconductor layer 15 to reach the substrate 10. Based on etching conditions, the principal surface of the substrate 10 may also be slightly etched, and thus a bottom surface of the groove 90 may be retracted further downward than an interface between the substrate 10 and the semiconductor layer 15. Also, the groove 90 may be formed after forming the p-side electrode 16 and the n-side electrode 17.

Figure 5B:
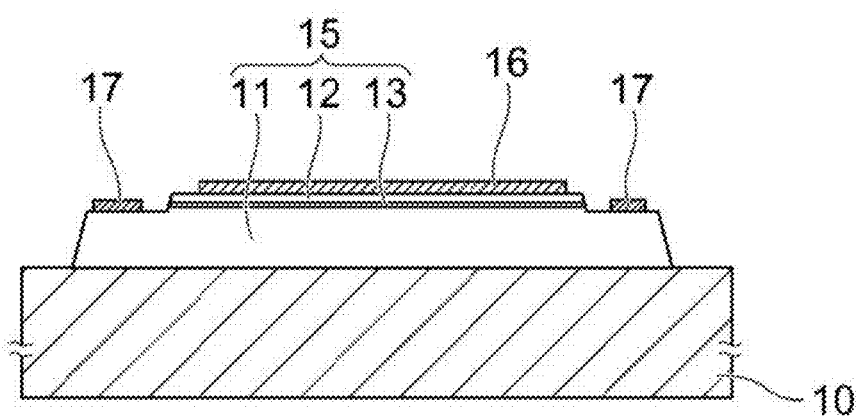

Next, as illustrated in FIG. 5B, the p-side electrode 16 is formed on the surface of the second semiconductor layer 12. In addition, the n-side electrode 17 is formed on the surface of the first semiconductor layer 11 in a region where portions of the second semiconductor layer 12 and the light-emitting layer 13 have been selectively removed.

The p-side electrode 16 formed in a region where the light-emitting layer 13 is laminated includes a reflection film that reflects radiation light of the light-emitting layer 13. For example, the p-side electrode 16 includes silver, a silver alloy, aluminum, an aluminum alloy, or the like. In addition, the p-side electrode 16 includes a metal protective film (barrier metal) in order to prevent the reflection film from being sulfurized or oxidized.

Figure 6A:
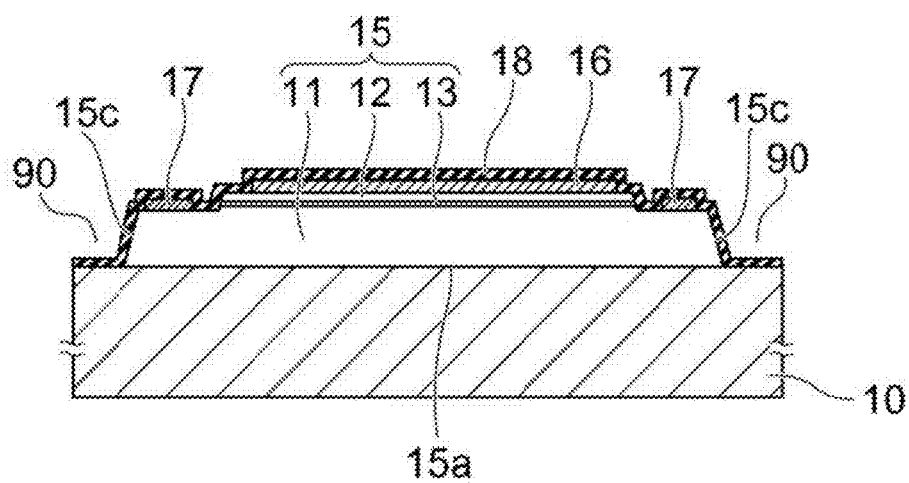
Figure 6B:
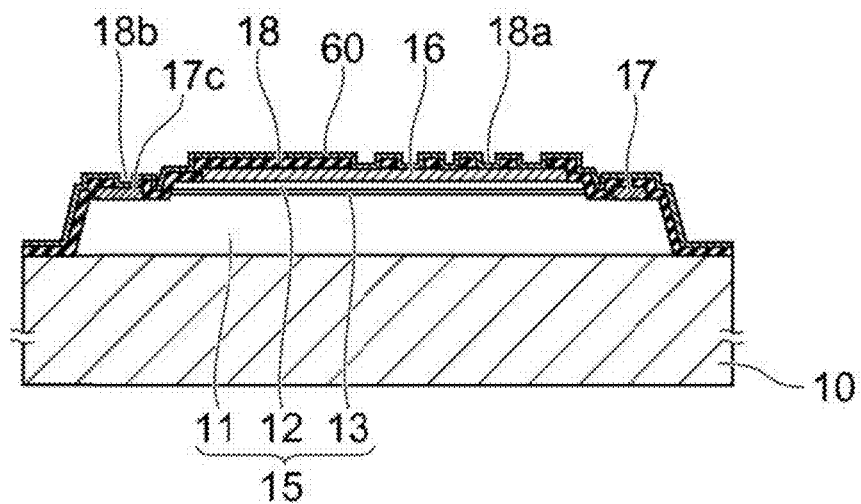

Next, as illustrated in FIG. 6A, the insulating film 18 is formed so as to cover the laminate body provided on the substrate 10. The insulating film 18 covers the second surface of the semiconductor layer 15, the p-side electrode 16, and the n-side electrode 17. In addition, the insulating film 18 covers the side surface 15c extending to the first surface 15a of the semiconductor layer 15. Further, the insulating film 18 is also formed on the surface of the substrate 10 which is the bottom surface of the groove 90.

The insulating film 18 is a silicon oxide film or a silicon nitride film which is formed by, for example, a chemical vapor deposition (CVD) method. As illustrated in FIG. 6B, the first openings 18a and the second opening 18b are formed in the insulating film 18 by, for example, wet etching using a resist mask. The first openings 18a reach the p-side electrode 16, and the second opening 18b reaches the contact portion 17c of the n-side electrode 17.

Next, as illustrated in FIG. 6B, the metal film 60 is formed on the surface of the insulating film 18, on the inner wall (side wall and bottom surface) of the first opening 18a, and on the inner wall (side wall and bottom surface) of the second opening 18b. As illustrated in FIG. 7A, the metal film 60 includes the base metal film (aluminum film) 61, the adhesion layer (titanium film) 62, and the seed layer (copper film) 63. For example, the metal film 60 is formed by a sputtering method.

Figure 7B:
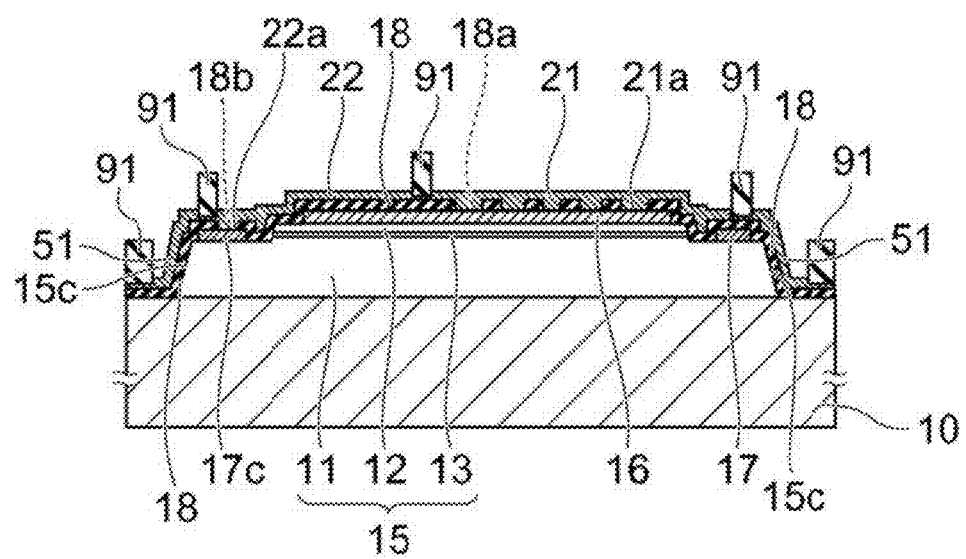

Next, a resist mask 91 illustrated in FIG. 7B is selectively formed on the metal film 60, and then the p-side wiring layer 21, the n-side wiring layer 22, and the reflection film 51 are formed by electrolyte copper plating using the copper film 63 of the metal film 60 as a seed layer.

The p-side wiring layer 21 is also formed within the first openings 18a to be electrically connected to the p-side electrode 16. The n-side wiring layer 22 is also formed within the second opening 18b to be electrically connected to the contact portion 17c of the n-side electrode 17.

Figure 8A:
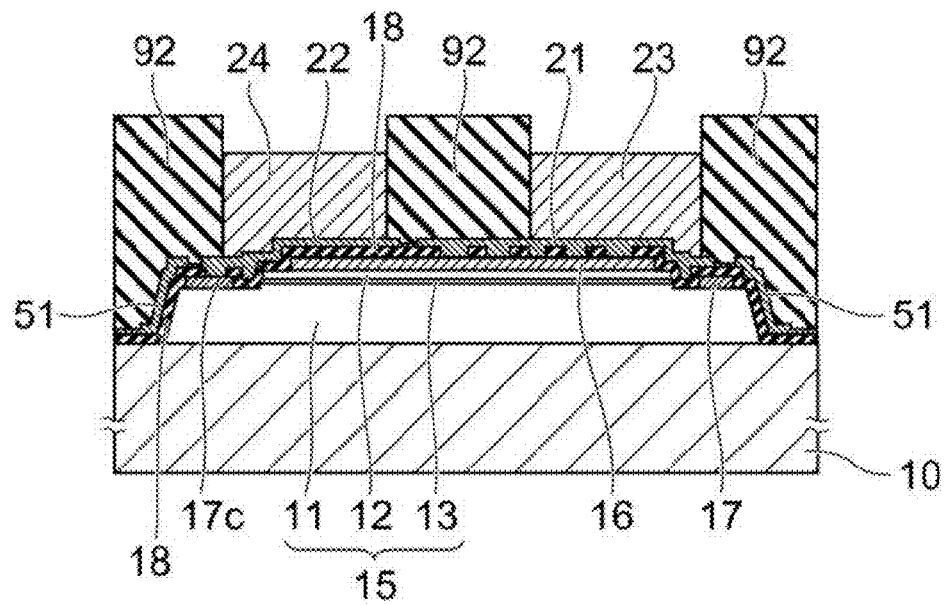

Next, the resist mask 91 is removed using, for example, a solvent or oxygen plasma, and then a resist mask 92 illustrated in FIG. 8A is selectively formed. Alternatively, the resist mask 92 may be formed without removing the resist mask 91.

After the resist mask 92 is formed, the p-side metal pillar 23 and the n-side metal pillar 24 are formed by electrolyte copper plating using the p-side wiring layer 21 and the n-side wiring layer 22 as seed layers.

The p-side metal pillar 23 is formed on the p-side wiring layer 21. The p-side wiring layer 21 and the p-side metal pillar 23 are integrated using the same copper material. The n-side metal pillar 24 is formed on the n-side wiring layer 22. The n-side wiring layer 22 and the n-side metal pillar 24 are integrated using the same copper material.

The resist mask 92 is removed using, for example, a solvent or oxygen plasma. At this point, the p-side wiring layer 21 is connected to the n-side wiring layer 22 through the metal film 60. In addition, the p-side wiring layer 21 is also connected to the reflection film 51 through the metal film 60, and the n-side wiring layer 22 is also connected to the reflection film 51 through the metal film 60.

Consequently, the metal film 60 between the p-side wiring layer 21 and the n-side wiring layer 22, the metal film 60 between the p-side wiring layer 21 and the reflection film 51, and the metal film 60 between the n-side wiring layer 22 and the reflection film 51 are removed by etching. At this time, the p-side wiring layer 21, the n-side wiring layer 22, the p-side metal pillar 23, and the n-side metal pillar 24 which are sufficiently thicker than the metal film 60 are used as masks.

The seed layer (copper film) 63, the adhesion layer (titanium film) 62, and the base metal film (aluminum film) 61 are selectively etched using different etchants.

Figure 9A:
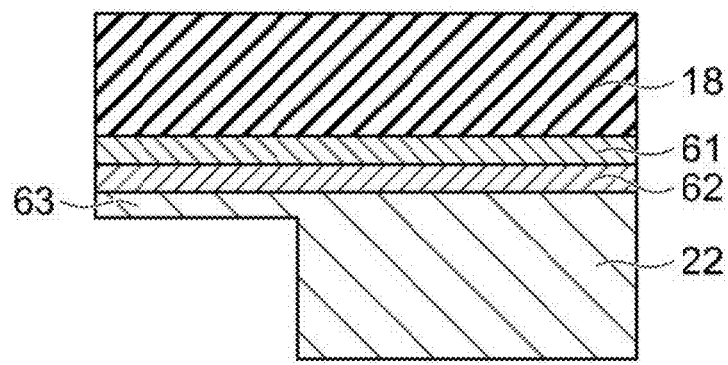
Figure 9B:
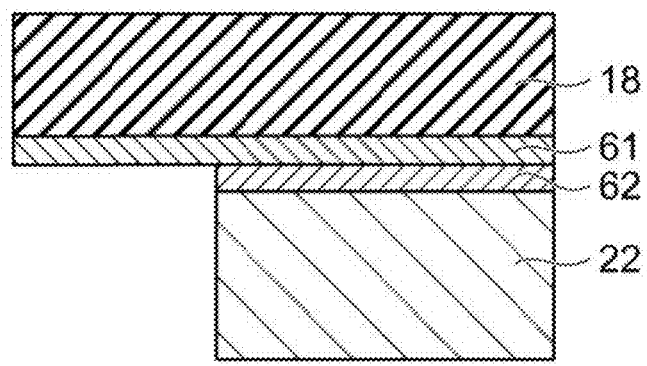

As illustrated in FIGS. 9A and 9B, first, the seed layer (copper film) 63 is etched, and then the adhesion layer (titanium film) 62 is etched. Thereafter, the base metal film (aluminum film) 61 is etched.

Figure 8B:
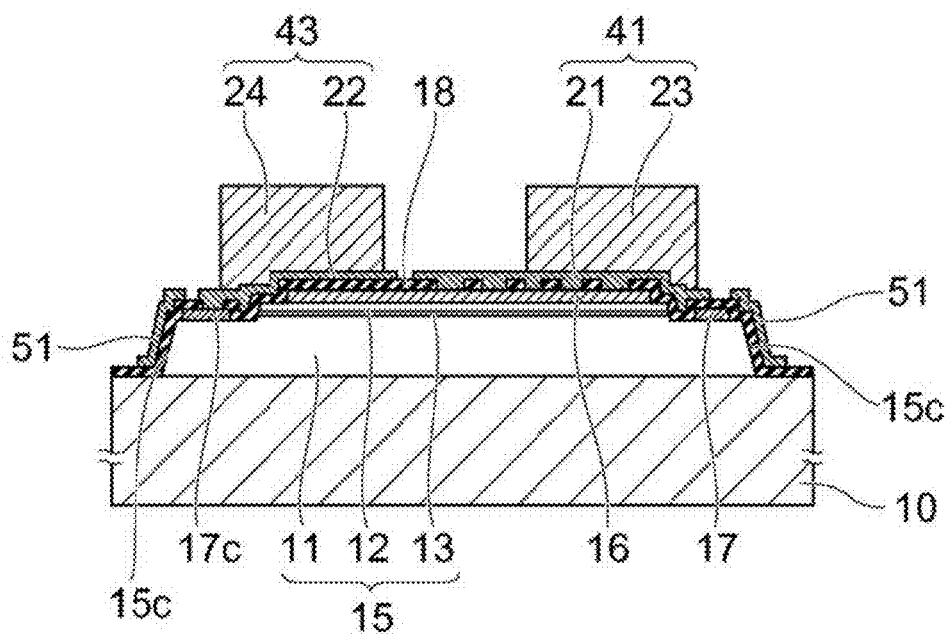

Thus, electrical connection between the p-side wiring layer 21 and the n-side wiring layer 22, electrical connection between the p-side wiring layer 21 and the reflection film 51, and electrical connection between the n-side wiring layer 22 and the reflection film 51 through the metal film 60 are disconnected (FIG. 8B).

Figure 9C:
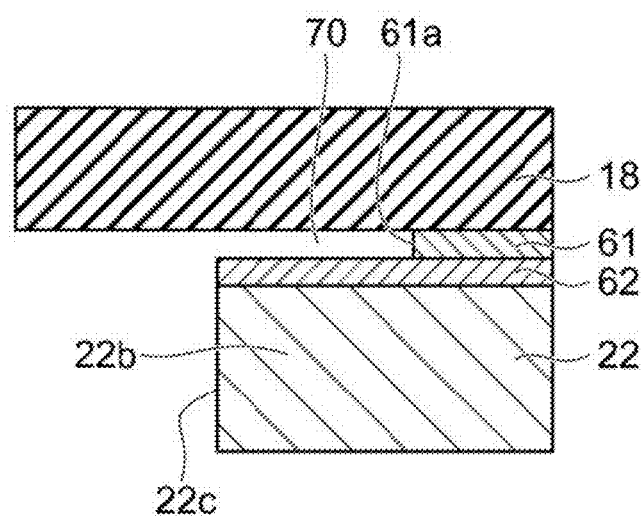

In addition, during etching the base metal film (aluminum film) 61, etching is advanced even after removing a portion of the base metal film 61 where the n-side wiring layer 22 is not provided, so that the edge 61a of the base metal film 61 is retracted further than the edge (side surface) 22c of the n-side wiring layer 22 as illustrated in FIG. 9C. Thus, an air gap 70 is formed between the end 22b of the n-side wiring layer 22 (end of the adhesion layer 62) and the insulating film 18. The same is applicable to the end of the p-side wiring layer 21.

For example, an alkali-based chemical solution such as a tetramethylammonium hydroxide (TMAH) solution or a mixed acid (mixture of nitric acid and sulfuric acid) solution is used for the wet etching of the base metal film 61 which is in this example an aluminum film. A copper film and a titanium film are not significantly etched by the chemical solution used for etching the base metal film 61.

Figure 10A:
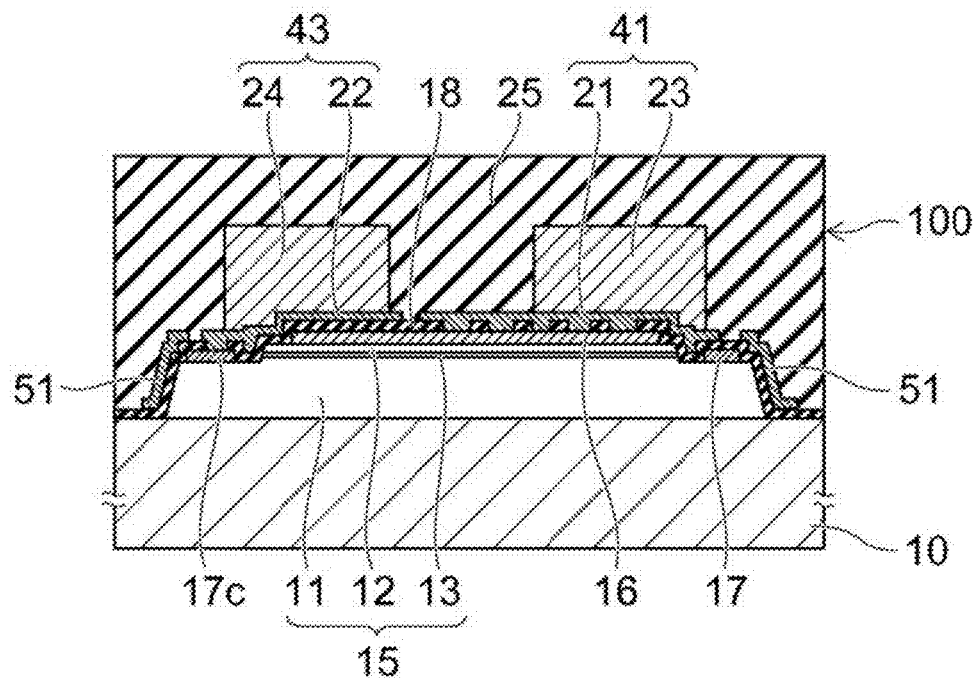

Next, the resin layer 25 illustrated in FIG. 10A is formed on the laminate body illustrated in FIG. 8B. The resin layer 25 covers the p-side wiring portion 41 and the n-side wiring portion 43. In addition, the resin layer 25 covers the reflection film 51.

The resin layer 25 as a second insulating film which reinforces the wiring portion is applied in a fluent liquid state (low viscosity state), enters the air gap 70 between the end of the wiring layer and the insulating film. 18, and is then hardened (cured). Alternatively, the second insulating film may be formed by applying and then hardening a liquid glass (e.g., spin-on-glass).

The resin layer 25 forms the support body 100 in combination with the p-side wiring portion 41 and the n-side wiring portion 43. The substrate 10 is removed as the semiconductor layer 15 is supported by the support body 100.

For example, the substrate 10, which is a silicon substrate, is removed by dry etching. In addition, the substrate (silicon substrate) 10 may be removed by wet etching. Alternatively, if the substrate 10 is a sapphire substrate, the substrate may be removed by a laser lift-off method.

The semiconductor layer 15, which was epitaxially grown on the substrate 10, may include a large internal stress. The p-side metal pillar 23, the n-side metal pillar 24, and the resin layer 25 are flexible materials as compared with, for example, the semiconductor layer 15 which is a GaN-based material. Accordingly, even if the internal stress during epitaxial growth is released at once when detaching the substrate 10, the p-side metal pillar 23, the n-side metal pillar 24, and the resin layer 25 absorb the stress. For this reason, it is possible to prevent the semiconductor layer 15 from being damaged in a process of removing the substrate 10.

Figure 10B:
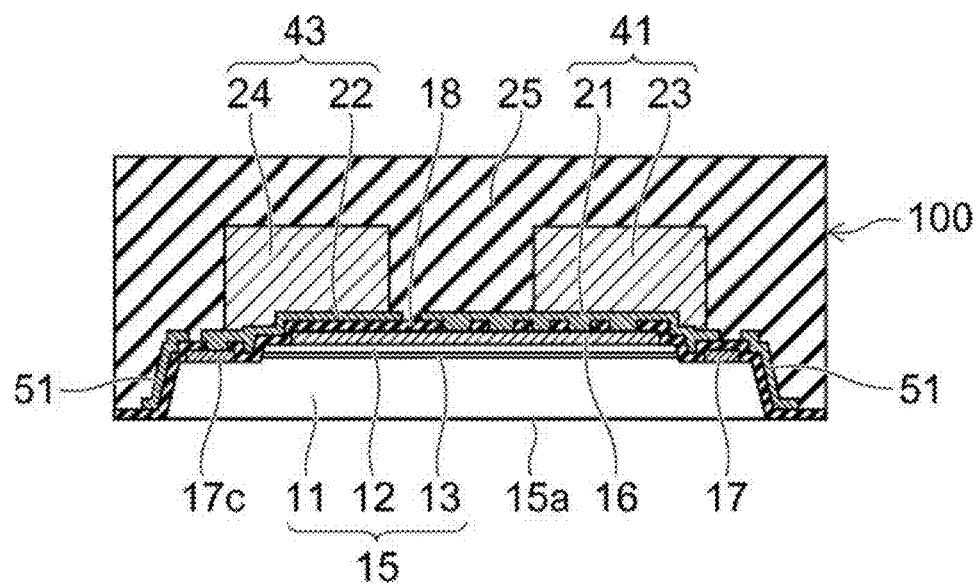

As illustrated in FIG. 10B, the first surface 15a of the semiconductor layer 15 is exposed by the removal of the substrate 10. Minute irregularities are formed in the exposed first surface 15a. Wet etching is performed on the first surface 15a using, for example, a potassium hydroxide (KOH) solution, TMAH or the like. In the etching, a difference in an etching rate depending on the crystal-plane orientation occurs. For this reason, it is possible to form the irregularities in the first surface 15a. The minute irregularities being formed in the first surface 15a may result in an improvement in the extraction efficiency of radiation light of the light-emitting layer 13.

Figure 11A:
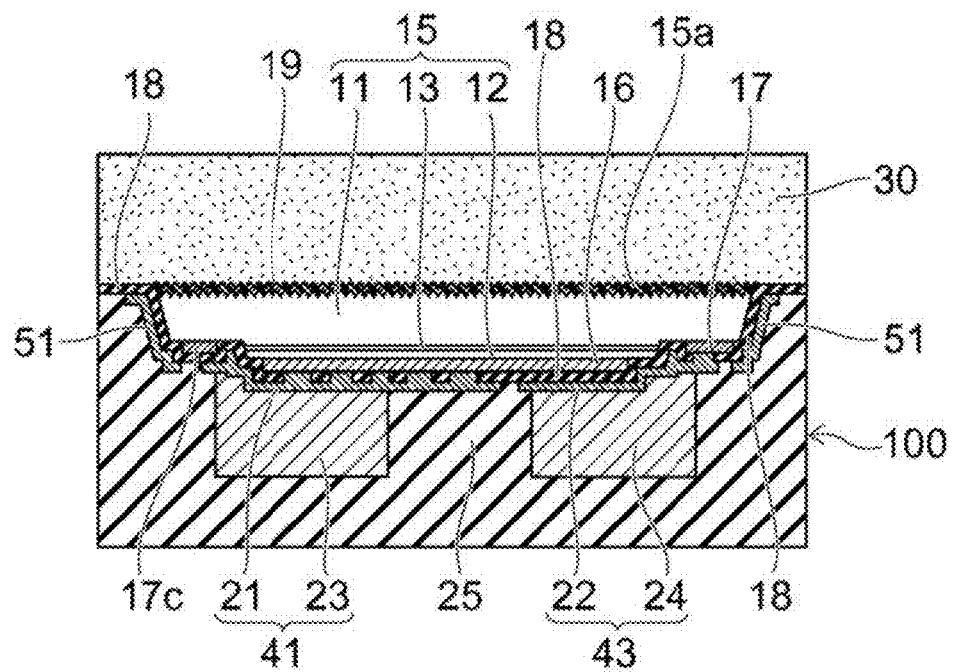

As illustrated in FIG. 11A, the phosphor layer 30 is formed on the first surface 15a through the insulating film 19. The phosphor layer 30 is formed by a method such as, for example, printing, potting, molding, or compression molding. The insulating film 19 increases adhesion between the semiconductor layer 15 and the phosphor layer 30.

In addition, as the phosphor layer 30, a sintered phosphor obtained by sintering a phosphor through a bonding material may be attached to the phosphor layer 30 through the insulating film 19.

In addition, the phosphor layer 30 is also formed on the region outside the periphery of the side surface 15c of the semiconductor layer 15. The resin layer 25 is also provided in the region outside the chip, and the phosphor layer 30 is formed on the resin layer 25 via the insulating film 18.

Figure 11B:
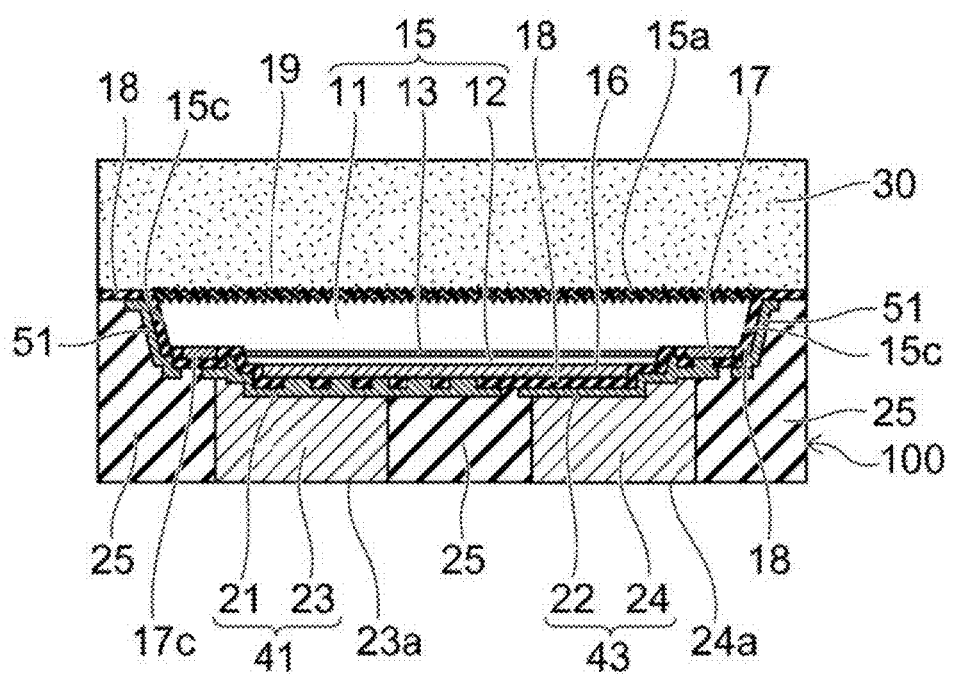

After the phosphor layer 30 is formed, the surface of the resin layer 25 (lower surface in FIG. 11A) is ground (polished), and thus the p-side metal pillar 23 and the n-side metal pillar 24 are exposed from the resin layer 25 as illustrated in FIG. 11B. The exposed surface of the p-side metal pillar 23 serves as the p-side external terminal 23a, and the exposed surface of the n-side metal pillar 24 serves as the n-side external terminal 24a.

Next, a structure illustrated in FIG. 11B is cut off in a region where the above-described groove 90 separating the plurality of semiconductor layers 15 is formed. That is, the phosphor layer 30, the insulating film 18, and the resin layer 25 are cut off. These layers and film are cut off using, for example, a dicing blade or a laser beam. The semiconductor layer 15 is not damaged due to dicing because of its absence from a dicing region.

The above-described processes before the separation are performed on a wafer including many semiconductor layers 15 (many LED chips). The wafer is separated into many semiconductor light-emitting devices including at least one semiconductor layer 15. The semiconductor light-emitting device thus formed may have a single-chip structure including one semiconductor layer 15 or may have a multi-chip structure including a plurality of semiconductor layers 15.

Since the above-described processes are performed on a full wafer before dicing, it is not necessary to form a wiring layer, to form a pillar, to perform packaging using a resin layer, and to form a phosphor layer on already separated devices, and thus it is possible to remarkably reduce processing costs by processing undiced wafers rather than performing processing stepson individual/separated dies (single chip or multi-chip components).

Since the support body 100 and the phosphor layer 30 are formed on an undiced wafer and then diced, the side surface of the phosphor layer 30 and the side surface of the support body 100 (side surface of the resin layer 25) are aligned with each other, thereby forming a side surface of the semiconductor light-emitting device in which the above-described side surfaces are separated from each other. Accordingly, it is possible to provide a small-sized semiconductor light-emitting device having a chip-size package structure, without inclusion of the (growth) substrate 10 in the final device.

Figure 12A:
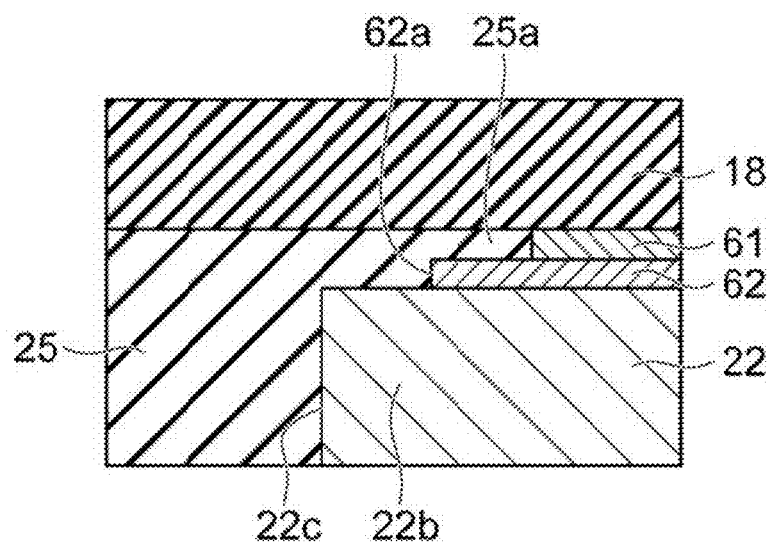
FIGS. 12A and 12B are schematic cross-sectional views illustrating portions of a semiconductor light-emitting device according to an embodiment.

In the removal of the metal film 60 in a portion where the wiring layers 21 and 22 are not provided, an edge 62a of the adhesion layer (titanium film) 62 may also be retracted with respect to the edge 22c of the wiring layer 22 as illustrated in FIG. 12A.

According to the structure, since a plurality of bending portions (stepped portions) are formed in a path ranging from an interface between the edge 22c of the wiring layer 22 and the resin layer 25 to the vicinity of the edge of the base metal film 61 where a crack is likely to occur, moisture infiltrated through the interface between the edge 22c of the wiring layer 22 and the resin layer 25 is less likely to reach the crack.

Figure 12B:
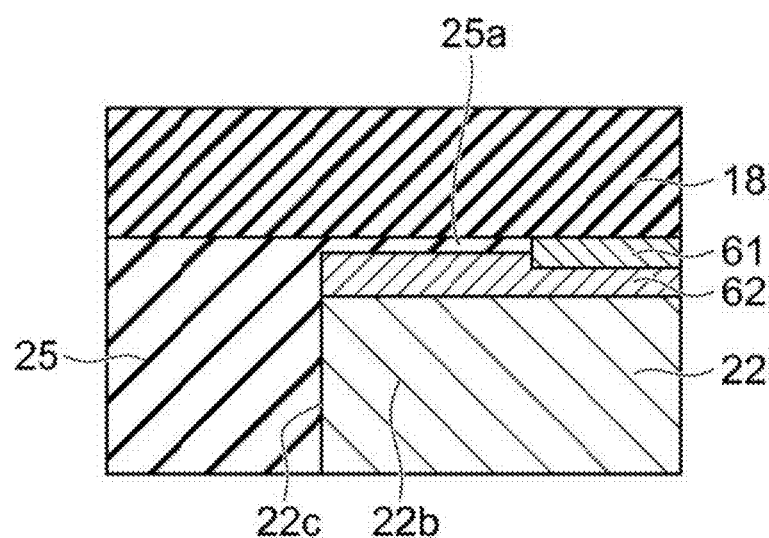

In addition, as illustrated in FIG. 12B, a film thickness of the resin 25a between the end 22b of the wiring layer 22 (end of the adhesion layer 62) and the insulating film 18 may be smaller than a film thickness of the base metal film 61.

However, there is concern that the stepped portion, illustrated in FIG. 12B, formed at a location in the adhesion layer 62 which contacts the end of the base metal film 61 be likely to prevent moisture infiltrated up to the insulating film 18 side from escaping to the outside in a heating process.

For this reason, it is preferable that the film thickness of the resin 25a between the end 22b of the wiring layer 22 and the insulating film 18 be equal to or larger than the film thickness of the base metal film 61.

Figure 14:
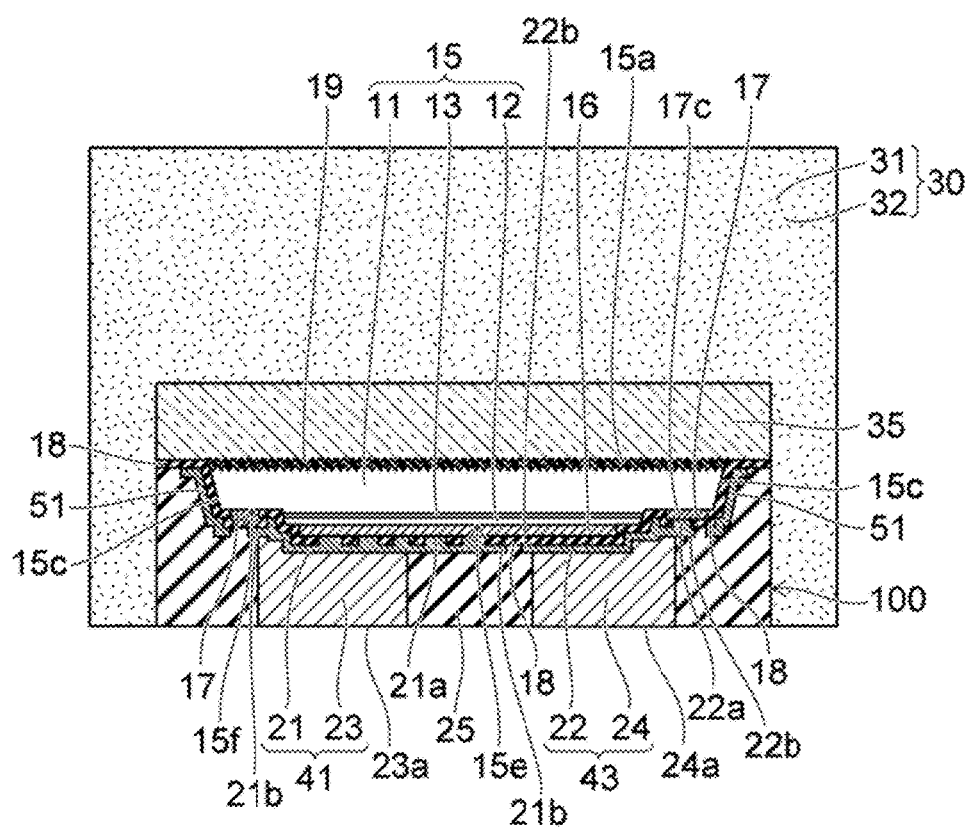
FIG. 14 is a schematic cross-sectional view illustrating a semiconductor light-emitting device according to a second embodiment.

FIG. 14 is a cross-sectional schematic view of a semiconductor light-emitting device according to another embodiment (second embodiment).

As shown in FIG. 14, a transparent layer 35 (optical layer) is formed on a first surface 15a of a semiconductor layer 15 by way of an insulation layer 19. A phosphor layer 30 is formed on an upper surface of the transparent layer 35, a side surface of the transparent layer 35 and a side surface of a support body 100.

The transparent layer 35 transmits radiation light of a light emitting layer 13 and radiation light of a phosphor 31. The transparent layer 35 is formed using the same material as a bonding material 32, for example. The transparent layer 35 may be formed using a material different from a material used for forming the bonding material 32, for example.

The transparent layer 35 is also formed on a chip external region around a side surface 15c of the semiconductor layer 15. Accordingly, a planar size of the transparent layer 35 is larger than a planar size of the semiconductor layer 15. In the chip external region (region peripheral to side surface 15c), the transparent layer 35 is formed on insulation film 18.

The phosphor layer 30 is formed around the transparent layer 35, around the semiconductor layer 15 and around the support body 100, and forms a side surface of the semiconductor light-emitting device. The side surface of the transparent layer 35 and the side surface of the support body 100 are covered by the phosphor layer 30. Due to such a constitution, the occurrence of cracks on the side surface of the support body 100 can be prevented.

Further, an intrusion path of moisture through a boundary between the phosphor layer 30 and a resin layer 25 becomes long and hence, it is difficult for moisture to reach the chip. Accordingly, the intrusion of moisture to electrodes 16, 17 and the semiconductor layer 15 can be suppressed thus providing a highly reliable semiconductor light-emitting device.

The transparent layer 35 is provided between the upper surface 15a of the semiconductor layer 15 and the phosphor layer 30. Due to such a constitution, a distance between a light emitting surface which is included in the semiconductor layer 15 and the phosphor 31 which is included in the phosphor layer 30 is increased. Accordingly, the temperature elevation of the phosphor 31 is suppressed and hence, lowering of a wavelength conversion efficiency of the phosphor 31 due to heating is suppressed.

In addition to the above-mentioned constitution, the transparent layer 35 may be formed using a material having a higher index of refraction than the phosphor layer 30, for example. The transparent layer 35 has index of refraction which falls between the index of refraction of the semiconductor layer 15 and the index of refraction of the phosphor layer 30. With the use of such a transparent layer 35, the index difference between mediums existing in the light extraction direction becomes small and hence, radiation light of the light emitting layer 13 is more easily radiated to the outside (air) of the phosphor layer 30. That is, an extraction efficiency of light radiated from the light emitting layer 13 is enhanced.

Further, an area of the light emitting layer 13 covered by the transparent layer 35 is enlarged. Accordingly, an area of the phosphor layer 30 where light (for example, blue light) of the light emitting layer 13 is incident is increased by the transparent layer 35 and hence, the conversion efficiency can be enhanced.

Still further, according to this second embodiment, optical matching adjustment can be performed with higher accuracy. Accordingly, the optical characteristic of the semiconductor light-emitting device can be enhanced.

In the above-described embodiments, the optical layer provided on the first surface 15a side of the semiconductor layer 15 is not limited to the phosphor layer, and may be a scattering layer. The scattering layer includes a scattering material having a plurality of particulate scattering materials (for example, titanium compounds, e.g., titanium dioxide) which scatter radiation light of the light-emitting layer 13, and a bonding material (for example, a resin layer) which integrates the plurality of scattering materials and transmits the radiation light of the light-emitting layer 13. In addition to the above constitutions, the transparent layer 35 may contain one or both of a phosphor and a scattering material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting device, comprising:
   a semiconductor layer having a light-emitting layer between a first side and a second side of the semiconductor layer in a first direction;
   a first electrode on the second side of the semiconductor layer;
   a second electrode on the second side of the semiconductor layer;
   a first insulating film on the second side of the semiconductor layer including a first portion covering a surface of the first electrode and a second portion covering a surface of the second electrode;
   a first wiring portion on the first insulating film and connected to the surface of first electrode through a first opening in the first insulating film;
   a second wiring portion on the first insulating film and connected to the surface of second electrode through a second opening in the first insulating film; and
   a second insulating film between the first wiring portion and the second wiring portion,
   wherein a first portion of the second insulating film is between the first portion of first insulating film and the first wiring portion in the first direction.

2. The semiconductor light-emitting device according to claim 1, wherein
   a second portion of the second insulating film is between the first insulating film and the second wiring portion.

3. The semiconductor light-emitting device according to claim 1, wherein
   the first wiring portion includes a first base metal film directly contacting the first insulating film and a first wiring layer disposed on the first base metal film,
   the second wiring portion includes a second base metal film directly contacting the first insulating film and a second wiring layer disposed on the second base metal film,
   the first portion of the second insulating film is between an end of the first wiring layer and the first insulating film and the first base metal film is not between the end of the first wiring layer and the first insulating film, and
   a second portion of the second insulating film is between an end of the second wiring layer and the first insulating film and the second base metal film is not between the end of the second wiring layer and the first insulating film.

4. The semiconductor light-emitting device according to claim 3, wherein the first base metal film and the second base metal film are each an aluminum film.

5. The semiconductor light-emitting device according to claim 3, wherein
a film thickness of the first portion of the second insulating film between the end of the first wiring layer and the first insulating film is equal to a film thickness of the first base metal film, and
a film thickness of the second portion of the second insulating film between the end of the second wiring layer and the first insulating film is equal to a film thickness of the second base metal film.

6. The semiconductor light-emitting device according to claim 3, wherein
a ratio of a length of the second insulating film between the end of the first wiring layer and the first insulating film to a film thickness of the first portion of the second insulating film is equal to or greater than 10, and
a ratio of a length of the second insulating film between the end of the second wiring layer and the first insulating film to a film thickness of the second portion of the second insulating film is equal to or greater than 10.

7. The semiconductor light-emitting device according to claim 3, wherein
the first wiring layer is thicker than the first base metal film, and
the second wiring layer is thicker than the second base metal film.

8. The semiconductor light-emitting device according to claim 3, wherein
the first wiring portion includes a first metal pillar disposed on the first wiring layer and which is thicker than the first wiring layer, and
the second wiring portion includes a second metal pillar disposed on the second wiring layer and which is thicker than the second wiring layer.

9. The semiconductor light-emitting device according to claim 1, wherein the second insulating film is a resin.

10. The semiconductor light-emitting device according to claim 1, further comprising:
an optical layer on the first side of the semiconductor layer and having transparency with respect to a wavelength of light emitted by the light-emitting layer.

11. The device according to claim 10, wherein
the optical layer is a phosphor layer including:
a plurality of phosphors which are excited by the wavelength of light emitted by the light-emitting layer emit a wavelength that is different from the wavelength of light emitted by the light-emitting layer, and
a bonding material incorporating the plurality of phosphors, the bonding material transmitting the wavelength of light emitted by the light-emitting layer and the plurality of phosphors.

12. The semiconductor light-emitting device according to claim 1, wherein
the second insulating film is provided on a side surface of the first wiring portion and a side surface of the second wiring portion, and the second insulating film extends beyond a periphery of the semiconductor layer, and
the phosphor layer extends beyond the periphery of the semiconductor layer and to cover a side surface of the second insulation film and form an outside surface of the semiconductor light-emitting device.

13. The semiconductor light-emitting device according to claim 12, wherein the optical layer further includes a transparent layer between the first side of the semiconductor layer and the phosphor layer.

14. The semiconductor light-emitting device according to claim 1, wherein the first insulation film is on a side surface of the semiconductor layer, the side surface of the semiconductor layer being contiguous with the first side.

15. The semiconductor light-emitting device according to claim 14, wherein a reflection film is on the side surface of the semiconductor layer via the first insulation film.

16. A light-emitting device, comprising:
a light-emitting layer on a first portion of a first semiconductor layer, a second semiconductor layer on the light-emitting layer with the light-emitting layer being between the second semiconductor layer and the first portion of the first semiconductor layer in a first direction, the first semiconductor layer having a second portion extending beyond an outer edge of the light-emitting layer in a second direction crossing the first direction;
a first insulation film in direct contact with a surface of the second semiconductor layer, a surface of the second portion of the first semiconductor layer, an outside edge surface of the light-emitting layer, and an outside edge surface of the second semiconductor layer;
a first wiring layer in direct contact with the first insulation film and electrically connected to the second semiconductor layer through a first opening in the first insulation film; and
a second insulation film filling a gap between the first insulation film and the first wiring layer in the first direction, the second insulation film extending along the first insulation film in the second direction from an edge of the first wiring layer for a distance that is greater than a distance along the first direction across the gap.

* * * * *